United States Patent
Watanabe

(10) Patent No.: US 7,502,060 B2
(45) Date of Patent: Mar. 10, 2009

(54) SOLID-STATE IMAGING DEVICE PROVIDING WIDE DYNAMIC RANGE AND HIGH LOW-ILLUMINANCE SENSITIVITY

(75) Inventor: Takashi Watanabe, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 568 days.

(21) Appl. No.: 10/540,761

(22) PCT Filed: Dec. 24, 2003

(86) PCT No.: PCT/JP03/16550

§ 371 (c)(1),
(2), (4) Date: Jun. 24, 2005

(87) PCT Pub. No.: WO2004/062274

PCT Pub. Date: Jul. 22, 2004

(65) Prior Publication Data

US 2006/0044436 A1    Mar. 2, 2006

(30) Foreign Application Priority Data

Dec. 27, 2002    (JP) .............................. 2002-379240

(51) Int. Cl.
*H04N 3/14*    (2006.01)
*H04N 5/335*    (2006.01)
*H01L 27/00*    (2006.01)

(52) U.S. Cl. ...................... 348/300; 348/301; 348/308; 250/208.1

(58) Field of Classification Search ................ 348/300, 348/301, 241, 243, 248, 313
See application file for complete search history.

(56) References Cited

U.S. PATENT DOCUMENTS 7,012,238 B2 *  3/2006  Watanabe ............... 250/214 A (Continued)

FOREIGN PATENT DOCUMENTS

JP        5030350        2/1993

(Continued)

OTHER PUBLICATIONS

Fox et al., "Wide-Dynamic-Range Pixel with Combined Linear and Logarithmic Response and Increased Signal Swing", Sensors and Camera Systems for Scientific, Industrial, and Digital Photography Applications, vol. 3965, pp. 4-10, Jan. 24, 2000.

*Primary Examiner*—Lin Ye
*Assistant Examiner*—Kelly L. Jerabek
(74) *Attorney, Agent, or Firm*—George W. Neuner; David G. Conlin; Edwards Angell Palmer & Dodge LLP

(57) ABSTRACT

There is provided a solid-state imaging device capable of achieving both of a wide dynamic range and a high low-illuminance sensitivity. A photodiode and a first transistor are provided in series between the ground and a drain of each of pixels, and a signal corresponding to a current or electric charge generated in the photodiode in accordance with an optical input is outputted from a detection node located between the photodiode and the first transistor. A control part executes control to alternately repeat a logarithmic operation period during which a photoelectric conversion signal logarithmically converted by setting a gate voltage $\phi_R$ of the first transistor to a first level is obtained and a linear operation period during which a linear type photoelectric conversion signal is obtained by setting the gate voltage $\phi_R$ of the first transistor to a second level.

8 Claims, 8 Drawing Sheets

U.S. PATENT DOCUMENTS

| | | | |
|---|---|---|---|
| 7,102,677 B2 * | 9/2006 | Watanabe | 348/308 |
| 2001/0015404 A1 | 8/2001 | Takada et al. | |
| 2001/0052940 A1 * | 12/2001 | Hagihara et al. | 348/302 |
| 2002/0021121 A1 | 2/2002 | Nakamura | |
| 2003/0193597 A1 * | 10/2003 | Fossum et al. | 348/308 |
| 2004/0196398 A1 * | 10/2004 | Doering et al. | 348/308 |

FOREIGN PATENT DOCUMENTS

| | | |
|---|---|---|
| JP | 10090058 | 4/1998 |
| JP | 2000175108 | 6/2000 |
| JP | 2001168311 | 6/2001 |
| JP | 2001339639 | 12/2001 |
| JP | 2002033961 | 1/2002 |

* cited by examiner

SOLID-STATE IMAGING DEVICE PROVIDING WIDE DYNAMIC RANGE AND HIGH LOW-ILLUMINANCE SENSITIVITY

TECHNICAL FIELD

The present invention relates to solid-state imaging devices and, more precisely, to a solid-state imaging device that is generally called an image sensor.

BACKGROUND ART

Recently, amplification type solid-state imaging devices in which the pixels are each provided with an amplification capability and read is performed by a scan circuit and, in particular, CMOS (Complementary Metal Oxide Semiconductor) type image sensors of which the pixels, peripheral drive circuits and signal processing circuits are of CMOS type, are widely used. In the CMOS type image sensor, it is necessary to form a photoelectric conversion part, an amplification part, a pixel selection part and so on in one pixel, and several MOS transistors (hereinafter sometimes abbreviated to Tr) are normally employed besides the photoelectric conversion part constructed of a photodiode (hereinafter sometimes abbreviated to PD).

FIG. 10A shows the construction of one pixel in the case of a PD+3Tr system. The diagram shows a photodiode 1, a detection node 3 and a reset part constructed of a MOS transistor 4 and a drain 5 to which a power voltage $V_D$ is applied. An amplification part 6 constructed of a MOS transistor, a pixel selection part 7 constructed of a MOS transistor, a signal line 8, a reset clock $\phi_{RS}$ and a pixel selection clock $\phi_S$ are also shown therein. FIG. 10B shows the operation of FIG. 10A by potential.

In FIGS. 10A and 10B, the photodiode 1 is first reset to the potential $V_D$ by reset operation of the reset part 4, and thereafter, a signal charge generated by incident light $h_v$ in the photodiode 1 is stored in the detection node 3 in a floating state. A potential $V_S$ of the detection node 3 falls from the potential $V_D$ due to the storage of electric charge, and the quantity of fall is proportional to the intensity of incident light and a storage period. Therefore, a variation $\Delta V_S$ in the potential $V_S$ is proportional to the intensity of incident light in the case of the storage in a certain period. The value is amplified in the amplification part 6 and thereafter selected by the pixel selection part, i.e., switch 7 for read to the signal line 8. Since the signal is proportional to the intensity of incident light in the construction of FIG. 10A, saturation disadvantageously occurs with a sufficiently intense quantity of light, failing in obtaining a wide dynamic range.

Accordingly, as shown in FIGS. 11A and 11B, a system, in which a photocurrent is read by logarithmic compression in order to obtain a wide dynamic range of incident light, is proposed. FIG. 11A is a diagram of a circuit construction of one pixel of the example. Although the case of an n-channel type is described below, the same argument can be similarly applied by inverting the polarity in the case of a p-channel type. The diagram shows a photodiode 1, a detection node 3, a logarithmic compression transistor 4 and a drain 5 to which a power voltage $V_D$ is applied. An amplification part 6, a pixel selection part 7, a signal line 8, a pixel selection clock $\phi_S$ and the power voltage $V_D$ are also shown. What is significantly different from the case of FIG. 10A is the arrangement that the DC (Direct Current) voltage $V_D$ is applied to the gate of the transistor 4 and the logarithmic compression is performed instead of the reset operation. The operation is described below. FIG. 11B is a diagram showing the operation of the transistor 4 in FIG. 11A by the potential relation.

As shown in FIG. 11A, since the gate voltage of the transistor 4 is fixed to the DC potential $V_D$, the potential becomes a constant value $\psi_G$ (H). When the source potential $V_S$ of the transistor 4 becomes deeper than the constant value $\psi_G$ (H), the transistor 4 operates to perform weak inversion operation, i.e., flow a subthreshold current Isubth. Since the source potential $V_S$ changes so that the subthreshold current Isubth becomes equal to the photocurrent Ip, the source potential $V_S$ eventually comes to have a value that is proportional to log (Ip), i.e., obtained by logarithmically converting the photocurrent. This makes it possible to achieve responses throughout a very wide range of the quantity of incident light and obtain a very wide dynamic range.

The logarithmic conversion type image sensor shown in FIGS. 11A and 11B is the device for performing detection in a steady state in which the photocurrent and the subthreshold current are balanced with each other. With a small quantity of incident light, the device cannot use the technique of increasing the amount of signal charge by increasing the storage time as in the storage type image sensor shown in FIGS. 10A and 10B. Furthermore, since a lower limit value Imin of the photocurrent that can be logarithmically converted is restricted by the dark current of the photodiode, an increase in the dark current due to a rise in temperature or the like causes a significant reduction in low-illuminance sensitivity. For the above reasons, the low-illuminance sensitivity of the logarithmic conversion type image sensor is usually inferior to that of the storage type image sensor.

Accordingly, as shown in FIGS. 12A and 12B, a system with a single device that exhibits a linear photoelectric conversion characteristic when the optical input is small and a logarithmic photoelectric conversion characteristic when the optical input is large is proposed (refer to, for example, JP H10-90058 A and JP 2000-175108 A). FIG. 12A shows the construction of one pixel including a photodiode 1, a detection node 3, a reset part 4 and a drain 5 to which a power voltage $V_D$ is applied as in FIG. 10A. An amplification part 6, a pixel selection part 7, a signal line 8 and a pixel selection clock $\phi_S$ are also shown. The power voltage $V_D$ and a voltage $V_H$ that is sufficiently higher than the power voltage $V_D$ are alternately applied to the gate $V_G$ of the reset part 4 via a switch 9 in a constant cycle. The operation of FIG. 12A is indicated by potentials in FIG. 12B and by timing in FIG. 12C. In FIGS. 12A, 12B and 12C, the voltage $V_H$ is first applied to the gate $V_G$ of the reset part 4 by the switch 9 in a period $T_2$. At this time, the potential $\psi_G(V_H)$ under the gate of the reset part 4 becomes deeper than the power voltage $V_D$, and the potential of the detection node 3 is reset to the power voltage $V_D$. Next, the power voltage $V_D$ is applied to the gate $V_G$ of the reset part 4 by the switch 9 in a period $T_1$. At this time, the potential $\psi_G(V_D)$ under the gate of the reset part 4 becomes shallower than the power voltage $V_D$, and the potential of the detection node 3 enters a floating state. When a signal charge is generated by incident light $h_v$ in the photodiode 1, the signal charge is stored in the detection node 3. In accordance with the storage of the signal charge, the potential $V_S$ of the detection node 3 is reduced from the power supply voltage $V_D$. The quantity of reduction is proportional to the intensity of incident light and the storage period. Therefore, in the storage of a certain period, a variation $\Delta V_S 1$ of the potential $V_S$ of the detection node 3 is proportional to the intensity of incident light. When the potential $V_S$ of the detection node 3 is reduced to a certain voltage value $\psi_0$, weak inversion operation occurs, i.e., a subthreshold current Isubth flows. Since the potential $V_S$ of the detection node 3 is changed by a variation $\Delta V_S 2$ from the value $\psi_0$ so that the subthreshold current Isubth becomes equal to the photocurrent Ip, and eventually, the value $\Delta V_S 2$ is proportional to log(Ip). That is, a value obtained by logarithmically converting the photocurrent results.

According to the above, the variation $\Delta V_S 1$ of the potential $V_S$ of the detection node 3 is proportional to the intensity of incident light when $V_D \geq V_S > \psi_0$, and the variation $\Delta V_S 2$ of the potential $V_S$ of the detection node 3 is proportional to log(Ip) when $\psi_0 \geq V_S > \psi_G(V_D)$. In this case, $\psi_G(V_D)$ is the potential under the gate of the reset part 4 when the power voltage $V_D$ is applied to the gate $V_G$. Therefore, a change in the potential $V_S$ of the detection node 3 with respect to the incident light exhibits a linear photoelectric conversion characteristic when the optical input is small and exhibits a logarithmic photoelectric conversion characteristic when the optical input is large as shown in FIG. 12D. As a result, it is possible to provide linear type operation of a high sensitivity at a low illuminance and logarithmic operation of a wide dynamic range at a high illuminance.

However, the system of FIGS. 12A, 12B, 12C and 12D has the following problems. First, the potential value, i.e., the boundary between the linear operation and the logarithmic operation $\psi_0$ varies every pixel. Therefore, very large harsh fixed pattern noises are generated without modification in the logarithmic operation region. Next, since the detection node 3 (assumed to have a capacitance $C_1$) is reset every time in the photodetection operation, so-called kTC noises (thermal noises) expressed by electron count as:

$$\Delta n = (kTC_1)^{1/2}/q$$

occur and become random noises. In the equation, k represents the Boltzman's constant, T represents the absolute temperature and q represents the amount of electronic charge. These fixed pattern noises and random noises largely deteriorate the image quality.

DISCLOSURE OF THE INVENTION

An object of the present invention is to solve the various problems and provide a solid-state imaging device capable of achieving both of a wide dynamic range and a high low-illuminance sensitivity.

In order to solve the problems, according to the present invention, there is provided a solid-state imaging device in which a photodiode and a first transistor are provided in series between a ground and a drain in each pixel, and a signal corresponding to a current or an electric charge generated in the photodiode according to an optical input is outputted from a detection node located between the photodiode and the first transistor, comprising:

a control part that executes control to alternately repeat a logarithmic operation period during which a photoelectric conversion signal logarithmically converted by setting a gate voltage of the first transistor to a first level is obtained and a linear operation period during which a linear photoelectric conversion signal is obtained by setting the gate voltage of the first transistor to a second level.

The "first level" and the "second level" should properly be set to levels at which the potentials of the signal charge become deeper and shallower, respectively, just under the gate of the first transistor. For example, in the case of an n-channel type solid-state imaging device, the "first level" and the "second level" correspond to High level and Low level, respectively.

In the solid-state imaging device of the present invention, the logarithmic operation period during which the logarithmically converted photoelectric conversion signal is obtained by setting the gate voltage of the first transistor to the first level and the linear operation period during which the linear type photoelectric conversion signal is obtained by setting the gate voltage of the first transistor to the second level are alternately repeated under the control of the control part.

During the logarithmic operation period, the logarithmically converted photoelectric conversion signal can be obtained at the detection node. Therefore, by taking out the signal from the detection node and transferring the signal, a logarithmic signal with a wide dynamic range is outputted. On the other hand, during the linear operation period, a linear photoelectric conversion signal can be obtained at the detection node. Therefore, by taking out the signal from the detection node and transferring the signal, a linear signal of a high sensitivity under a low illuminance is outputted. Therefore, according to the solid-state imaging device, both of the wide dynamic range and the low-illuminance high sensitivity can be achieved.

In the solid-state imaging device of one embodiment, the photodiode and the detection node are connected to each other. That is, one terminal of the photodiode and the detection node may be short-circuited to each other.

In one embodiment, a second transistor is connected between the photodiode and the detection node.

Since the second transistor is connected between the photodiode and the detection node in the solid-state imaging device of the embodiment, it is possible to reduce the capacitance of the detection node and enhance the electric charge voltage conversion efficiency during the linear operation period.

In one embodiment, the photodiode has a buried-channel structure.

Since the photodiode has the buried-channel structure in the solid-state imaging device of the embodiment, it becomes possible to largely reduce the dark current occurring in the photodiode. Therefore, it becomes possible to extend the lower limit of the photocurrent that can be logarithmically converted during the logarithmic operation period. Moreover, dark current noises can also be reduced during the linear operation period.

In one embodiment, the control part executes control so as to alternately repeat the logarithmic operation period and the linear operation period every frame, read a potential of the detection node as a linear type signal immediately before a transition from the linear operation period to the logarithmic operation period, and read the potential of the detection node as a logarithmic signal in the logarithmic operation period after a lapse of a certain period after the transition to the logarithmic operation period.

In the solid-state imaging device of the embodiment, the logarithmic operation period and the linear operation period are alternately repeated every frame. After the transition to the linear operation period, i.e., after the gate voltage of the first transistor changes from the first level to the second level, the photoelectrically converted electric charge starts to be stored in the detection node. Next, immediately before the transition from the linear operation period to the logarithmic operation period, i.e., immediately before the gate voltage of the first transistor changes from the second level to the first level, a largest amount of electric charge is stored in the detection node. If the electric charge is read as a linear signal, a high-sensitivity output is obtained. Moreover, it can be considered that a steady state in which the photocurrent and the sub-threshold current are balanced with each other is achieved after a lapse of a certain period after the gate voltage of the first transistor has changed from the second level to the first level. Therefore, the electric charge can be read as a logarithmic signal from the detection node during the logarithmic operation period after a lapse of a certain period after the transition to the logarithmic operation period.

The solid-state imaging device of one embodiment comprises:

a first frame memory which stores a signal read from the detection node of each pixel in the logarithmic operation period under a condition that light is irradiated to each pixel with a certain uniform intensity; and a subtraction part which subsequently forms an output by subtracting the signal recorded in the first frame memory from a signal read in an arbitrary frame in association with each pixel.

In the solid-state imaging device of the embodiment, the signal read from the detection node of each pixel within the logarithmic operation period under the condition that light is irradiated with a certain uniform intensity to each pixel is recorded in the first frame memory. Subsequently, the signal recorded in the first frame memory is subtracted from the signal read in an arbitrary frame in correspondence with each pixel. Therefore, variation in the characteristics of the pixels and, in particular, the characteristic variation (referred to as an "offset variation") attributed to the variation in the threshold values of the transistors can be canceled. Therefore, an image with reduced amount of fixed pattern noises can be obtained.

In one embodiment, the subtraction part forms an output by subtracting the signal recorded in the first frame memory from a signal read in the logarithmic operation period in association with each pixel.

In the solid-state imaging device of the embodiment, an image of a wide dynamic range and reduced amount of fixed pattern noises can be obtained.

The solid-state imaging device of one embodiment comprises:

a second frame memory which records the signal read from the detection node every time immediately before the transition from the logarithmic operation period to the linear operation period under a subject imaging condition; and a subtraction part which subtracts the signal recorded in the second frame memory from the signal read from the detection node immediately before the transition from the linear operation period to the logarithmic operation period in association with each pixel.

In the solid-state imaging device of the embodiment, the signal read from the detection node immediately before the transition from the logarithmic operation period to the linear operation period under the condition that light is irradiated with a certain uniform intensity to each pixel is recorded in the second frame memory. Subsequently, the signal recorded in the second frame memory is subtracted from the signal read from the detection node immediately before the transition from the linear operation period to the logarithmic operation period in association with each pixel. Therefore, it becomes possible to take out only the net linear signal component. Furthermore, a difference between the first and last signals of the storage of the signal charge is taken in this case, and therefore, a high-sensitivity image from which the reset noises are completely removed can be obtained.

BEST MODE FOR CARRYING OUT THE INVENTION

Figure 1A:
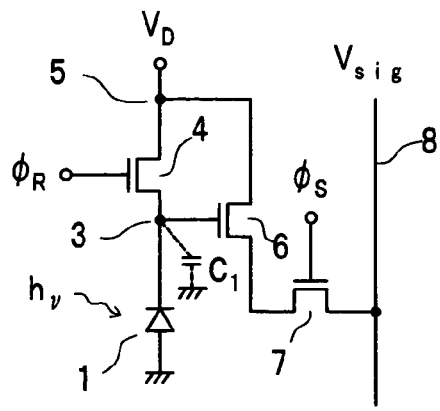
FIGS. 1A and 1B are diagrams showing circuit constructions of pixels used for a two-dimensional image sensor of one embodiment of a solid-state imaging device of the present invention.

The present invention will be described in detail below by the embodiments shown in the drawings.

Figure 5:
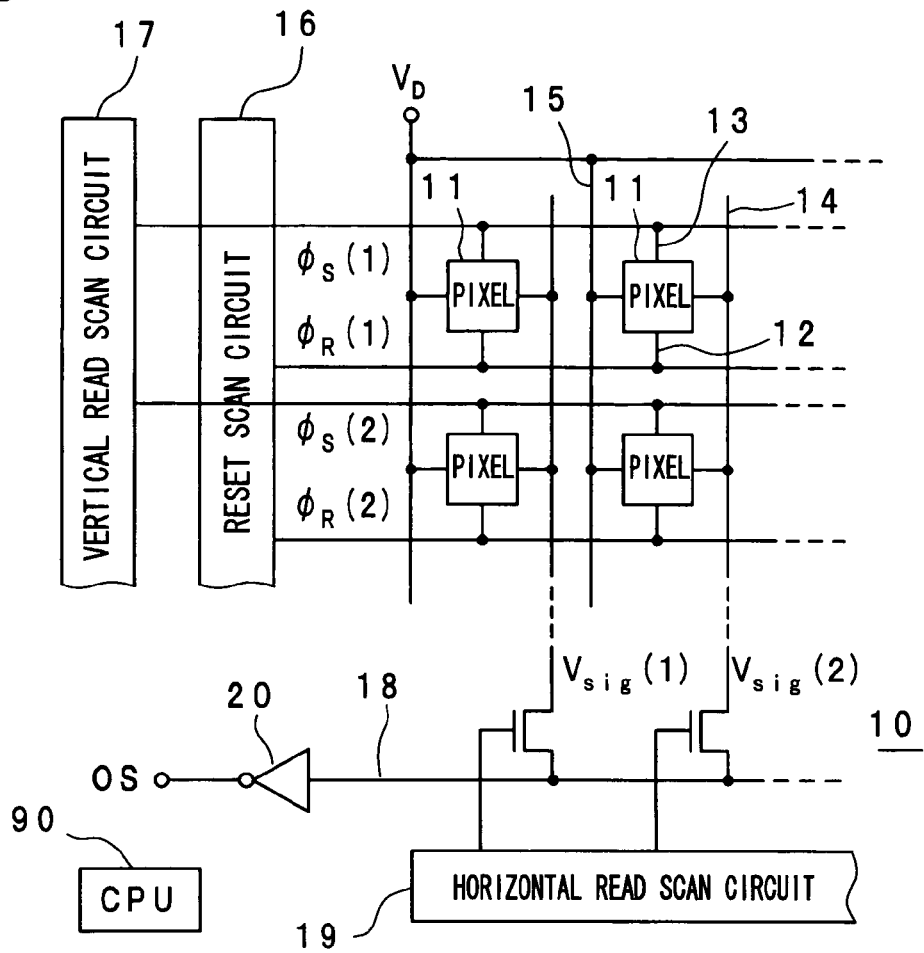
FIG. 5 is a diagram showing the circuit construction of a two-dimensional image sensor of one embodiment of a solid-state imaging device of the present invention.

FIG. 5 is a diagram that shows a two-dimensional image sensor 10 of one embodiment of the present invention with a circuit construction of 2×2 pixels. In the two-dimensional image sensor 10, a reference numeral 11 denotes a pixel of a circuit construction described later, 12 denotes a line for a reset clock $\phi_R$ applied to a first transistor, 13 denotes a line for a pixel selection clock $\phi_S$, 14 denotes a line for a signal Vsig and 15 denotes a power voltage $V_D$. The reset clock $\phi_R$ and the pixel selection clock $\phi_S$ are successively outputted in rows from a reset scan circuit 16 and a vertical read scan circuit 17. The rows of pixels are successively scanned in a vertical direction. The signals Vsig read in rows from the pixels are successively read in the horizontal direction to a horizontal signal line 18 by a signal from a horizontal read scan circuit 19. A signal from the horizontal signal line 18 is outputted as an output signal OS via an amplifier circuit 20. The entire operation of the two-dimensional image sensor 10 is controlled by a CPU (Central Processing Unit) 90 as one example of a control part.

FIG. 1A illustrates a circuit construction example of each of the pixels 11 shown in FIG. 5. In the figure are shown a photodiode 1, a detection node 3, a first transistor 4 and a drain 5 to which a power voltage $V_D$ is applied. Further shown are an amplification part 6 constructed of a MOS transistor, a pixel selection part 7 constructed of a MOS transistor, a signal line 8, a reset clock $\phi_R$ and a pixel selection clock $\phi_S$. The photodiode 1 and the first transistor 4 are provided in series between the ground and the drain 5. The logarithmic operation and the linear operation are performed as follows by using the pixel 11.

Figure 2A:
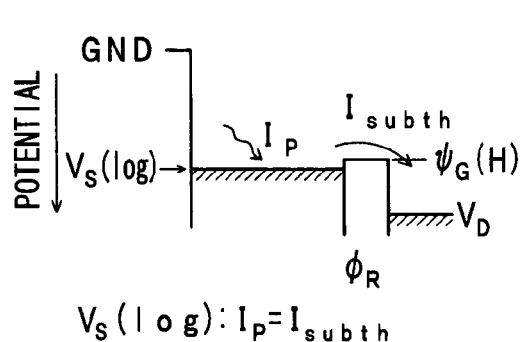
FIGS. 2A and 2B are diagrams showing potential distributions in logarithmic operation of the pixels shown in FIGS. 1A and 1B.

FIG. 2A shows potential relations when the logarithmic operation is performed by using the pixel of FIG. 1A. In this case, the gate of the first transistor 4 is maintained at the DC (Direct Current) level, and the potential has a constant value $\psi_G(H)$. When the source potential $V_S$ of the first transistor 4 becomes deeper than the constant value $\psi_G(H)$, the first transistor 4 enters weak inversion operation, and a subthreshold current Isubth flows. Since the source potential $V_S$ changes so that the subthreshold current Isubth becomes equal to the photocurrent Ip, $$V_S = K_1 \cdot \log(Ip) + K_2 \quad (1)$$

holds, and the source potential $V_S$ comes to have a value $V_S(\log)$ obtained by logarithmically converting the photocurrent Ip. In this case, $K_1$ and $K_2$ are constants. This makes it possible to achieve responses throughout a very wide range of the quantity of incident light and obtain a very wide dynamic range.

Figure 3A:
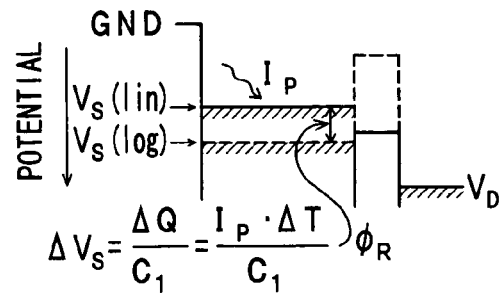
FIGS. 3A and 3B are diagrams showing potential distributions in linear operation of the pixels shown in FIGS. 1A and 1B.

FIG. 3A shows potential relations when the linear operation is performed by using the pixel of FIG. 1A. In this case, a pulse $\phi_R$ is applied to the gate of the first transistor 4. First, the gate of the first transistor 4 has been maintained at High level for a sufficiently long period before the start of signal storage, and the source potential $V_S$ comes to have a value $V_S(\log)$ at which the photocurrent Ip and the subthreshold current Isubth become equal to each other. Next, the gate of the first transistor 4 changes to Low level, and the signal storage starts. After a lapse of one frame period, the source potential is reduced to $V_S(\text{lin})$. Therefore, a variation $\Delta V_S = V_S(\text{lin}) - V_S(\log)$ of the source potential $V_S$ by the signal storage becomes:

$$\Delta V_S = (Ip \cdot \Delta T)/C_1 \quad (2)$$

which expresses a value obtained by linearly converting the photocurrent Ip. In this case, $\Delta T$ represents the storage time, and $C_1$ represents the capacitance of the detection node 3 shown in FIG. 1A.

Figure 1B:
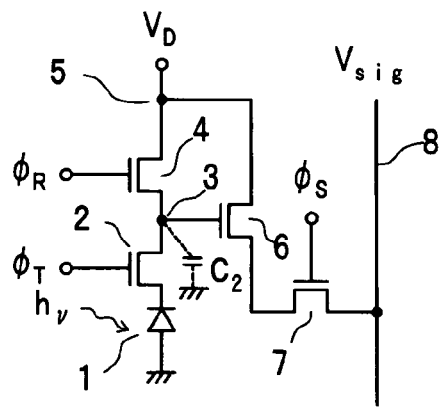

FIG. 1B illustrates the other circuit construction example of each of the pixels 11 shown in FIG. 5 different from that of FIG. 1A. The circuit construction of FIG. 1B differs from the one of FIG. 1A in that a second transistor 2 is inserted between the photodiode 1 and the detection node 3. A DC potential $\phi_T$ is applied to the gate of the transistor 2.

Figure 2B:
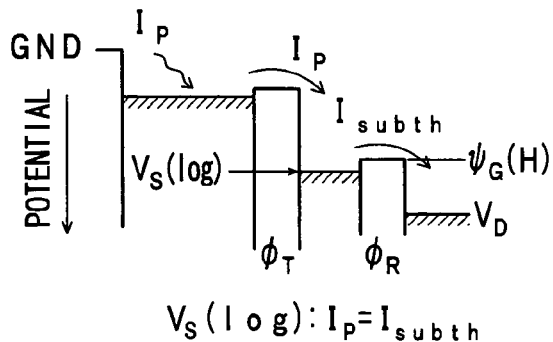

FIGS. 2B shows potential relations when the logarithmic operation is performed by using the pixel of FIG. 1B. Although a photocurrent Ip is generated in the photodiode 1, a current corresponding to the photocurrent Ip flows through the second transistor 2 in the steady state since the potential $\phi_T$ at the gate of the second transistor 2 is a DC potential, and the potential of the photodiode 1 is maintained at a constant value. Further, in this case, the potential $\phi_R$ of the gate of the first transistor 4 is a DC potential, and a subthreshold current Isubth flows. Since the potential $V_S$ of the detection node 3 changes so that the subthreshold current Isubth becomes equal to the photocurrent Ip, the potential $V_S$ of the detection node 3 comes to have a value $V_S(\log)$ obtained by logarithmically converting the photocurrent Ip according to Equation (1). This makes it possible to achieve responses throughout a very wide range of the quantity of incident light and obtain a very wide dynamic range.

Figure 3B:
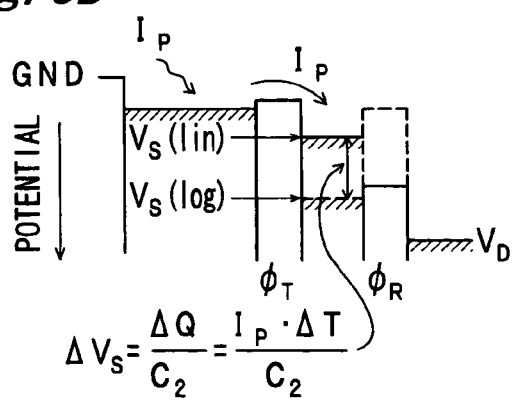

FIG. 3B shows potential relations when the linear operation is performed by using the pixel of FIG. 1B. Although the photocurrent Ip is generated in the photodiode 1, a current corresponding to the photocurrent Ip flows through the gate in the steady state since the potential $\phi_T$ of the gate of the second transistor 2 is a DC potential, and the potential of the photodiode 1 is maintained at a constant value. Further, in this case, the pulse $\phi_R$ is applied to the gate of the first transistor 4. First, the first transistor 4 has been maintained at High level for a sufficiently long period before the signal storage starts, and the source voltage comes to have a value $V_S(\log)$ at which the photocurrent Ip and the subthreshold current becomes equal to each other. Next, the gate potential of the first transistor 4 changes to Low level, and the signal storage starts. After a lapse of one frame, the source potential is reduced to $V_S(\text{lin})$. Therefore, a variation $\Delta V_S = V_S(\text{lin}) - V_S(\log)$ of $V_S$ by the signal storage becomes:

$$\Delta V_S = (Ip \cdot \Delta T)/C_2 \quad (3)$$

which expressed a value obtained by linearly converting the photocurrent Ip. In this case, $\Delta T$ represents the storage time, and $C_2$ represents the capacitance of the detection node 3 shown in FIG. 1B. Although $C_1$=(capacitance of photodiode 1+gate capacitance of transistor 6+stray capacitance of wiring and so on), $C_2$=(gate capacitance of transistor 6+stray capacitance of wiring and so on) and the area of the detection node 3 of FIG. 3B can be made sufficiently smaller than the area of the photodiode 1 of FIG. 3A, and therefore, $C_1 > C_2$. That is, it becomes possible to obtain in the case of FIG. 3B a signal voltage $\Delta V_S$ higher than in the case of FIG. 3A with the same amount of signal charge Ip·$\Delta T$.

Figure 4A:
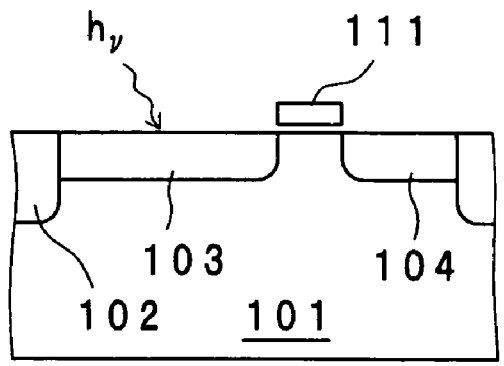
FIGS. 4A, 4B and 4C are views showing sectional structures when the pixels shown in FIGS. 1A and 1B are fabricated in a semiconductor substrate.
Figure 4B:
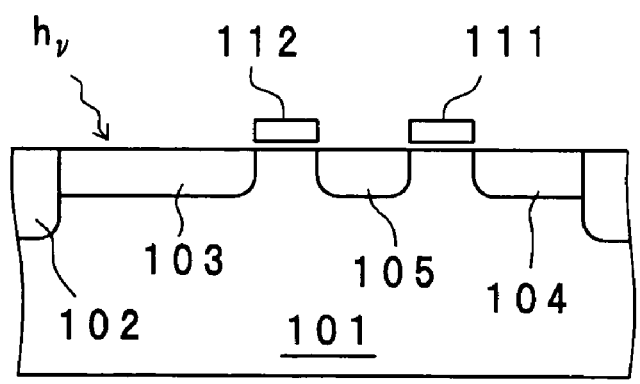
Figure 4C:
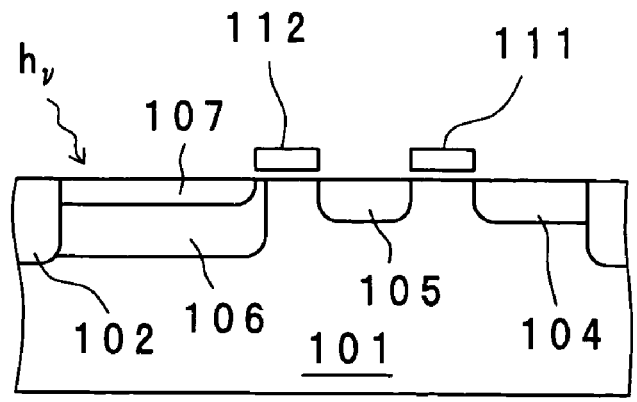

FIG. 4A schematically shows the sectional structure of the pixel of FIG. 1A fabricated in a semiconductor substrate. Likewise, FIGS. 4B and 4C schematically show the sectional structure of the pixel of FIG. 1B fabricated in a semiconductor substrate. A reference numeral 101 denotes a semiconductor substrate, 102 denotes a pixel isolation region, 103 denotes a cathode of the photodiode 1 (see FIGS. 1A and 1B), 104 denotes the drain 5, and 111 denotes the first transistor 4. In FIGS. 4B and 4C, a reference numeral 105 denotes an isolated detection node, which is separated from the cathode 103 of the photodiode 1 via the second transistor 112. Further, although the photodiode 1 has a simple PN junction structure and is formed concurrently with the drain 104 in FIGS. 4A and 4B, the photodiode has a buried-channel structure and is formed separately from the drain in FIG. 4C. That is, a signal charge storage layer 106 is formed on the substrate side, and a heavily doped pinning layer 107 is formed on the surface side. In general, a buried-channel structure photodiode is allowed to have a largely reduced dark current in comparison with the simple PN junction structure. This makes it possible to extend the lower limit Imin of the photocurrent capable of being logarithmically converted during the logarithmic operation. Moreover, dark current noises can be reduced also in the linear operation.

Figure 6:
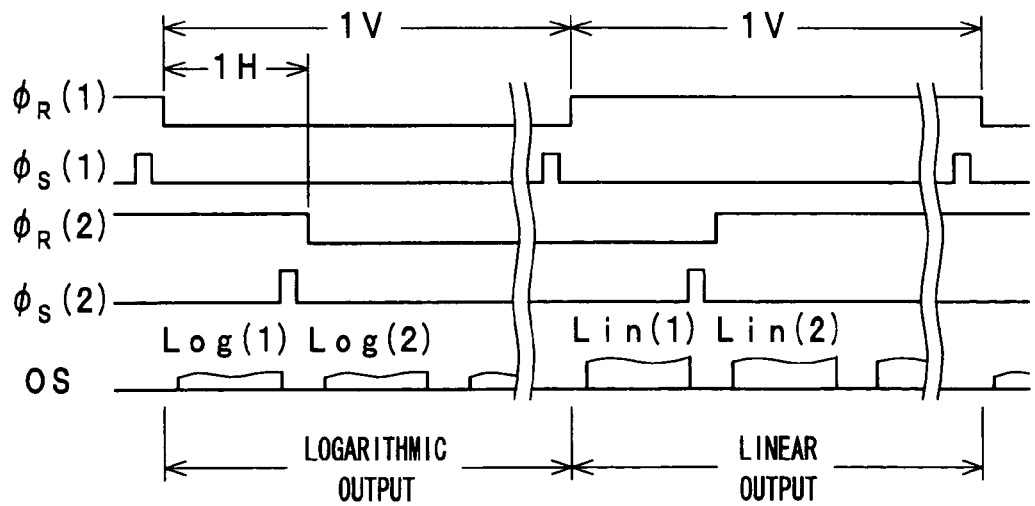
FIG. 6 is a chart showing the operation timing of the two-dimensional image sensor shown in FIG. 5.

FIG. 6 shows the operation timing of the two-dimensional image sensor 10 shown in FIG. 5. In this case, $\phi_R(1)$ and $\phi_R(2)$ represent the reset clocks of the first row and the second row, φ_S(1) and φ_S(2) represent the pixel selection clocks of the first row and the second row, and OS represents an output signal. Moreover, 1H represents one horizontal scan period, and 1V represents one frame period. Paying attention to the pixels of the first row, first, in a frame as a preceding logarithmic operation period (shown at the left-hand end in FIG. 6), the reset clock, i.e., the gate potential φ_R(1) of the first transistor 4 (see FIGS. 1A and 1B) is maintained at High level to obtain a logarithmically converted photoelectric conversion signal at the detection node 3. Subsequently, the gate potential φ_R(1) of the first transistor 4 is changed from High level to Low level for transition to the linear operation period. Then, by storing the photoelectrically converted electric charge in the detection node 3 only for one frame period, a linear type photoelectric conversion signal is obtained at the detection node 3. At this time, by turning on the pixel selection clock φ_S(1) immediately before the gate potential φ_R(1) changes from High level to Low level, a logarithmically converted photoelectric conversion signal Log(1) is outputted as the output signal OS. By turning on the pixel selection clock φ_S(1) after one frame, i.e., immediately before the gate potential φ_R(1) of the first transistor 4 changes from Low level to High level to transit from the linear operation period to the logarithmic operation period, a linear type photoelectric conversion signal Lin(1) is outputted as the output signal OS. The same thing can be said for the pixels of the second and subsequent rows except for sequential delays by one horizontal scan period. As described above, a frame in which the logarithmically converted photoelectric conversion signals Log(1), Log(2) and so on are obtained in units of 1H and a frame in which the linear type photoelectric conversion signals Lin(1), Lin(2) and so on are obtained in units of 1H alternate in the output signal OS.

Figure 7A:
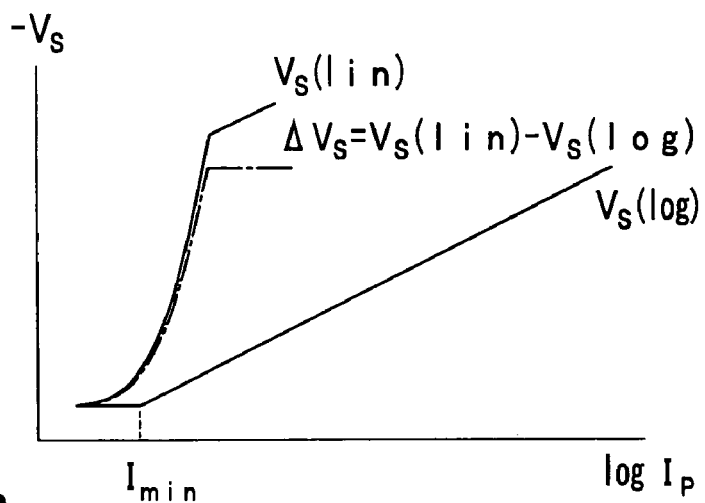
FIGS. 7A, 7B and 7C are graphs showing a logarithmic signal and a linear signal obtained by the present invention in relation to the intensity of incident light.
Figure 7B:
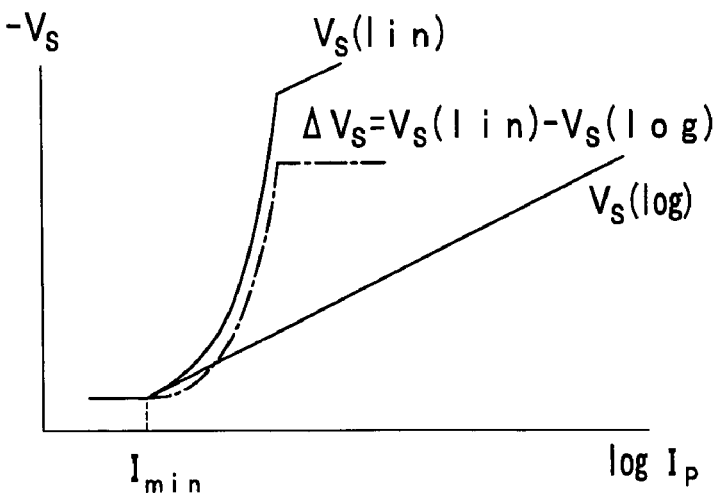

FIGS. 7A and FIG. 7B are graphs showing a logarithmically converted photoelectric conversion signal Vs(log) and a linear type photoelectric conversion signal Vs(lin) obtained as the potentials of the detection node 3 of the pixel with the logarithm log(Ip) of the intensity of incident light represented by the horizontal axis (since the change in the potential Vs of the detection node 3 with respect to an increase in the incident light is in the negative direction in FIGS. 1A and 1B, curves are inversely shown in FIGS. 7A and 7B for the sake of convenience). In this case, the logarithmically converted photoelectric conversion signal Vs(log) does not depend on the read period, or the length of one frame period (properly referred to as an "1V period") in the case of FIG. 6. On the other hand, the linear type photoelectric conversion signal Vs(lin) has a signal storage period of 1V, and therefore, the output is increased as the period 1V is prolonged. FIG. 7A corresponds to the case where the period 1V is long, and FIG. 7B corresponds to the case where the period 1V is short. The value of Vs(log) with respect to the intensity of incident light has a response lower limit value Imin limited by the dark current and has an upper limit value being extremely higher than the linear type photoelectric conversion signal Vs(lin). On the other hand, the value of the linear type photoelectric conversion signal Vs(lin) with respect to the intensity of incident light has a form such that the linearly converted signal is superimposed on the value of the immediately preceding logarithmic conversion type photoelectric conversion signal Vs(log). Therefore, the net linear signal component becomes ΔVs=Vs(lin)−Vs(log). When the storage time is long as in FIG. 7A, the value of ΔVs becomes sufficiently greater than Vs(log), and Vs(lin) comes to have a linear graphic curve almost identical to ΔVs. When the storage time is short as in FIG. 7B, the value of ΔVs becomes lower than Vs(log) on the low incident light intensity side, and Vs(lin) comes to have a nonlinear graphic curve considerably changed from ΔVs.

Figure 7C:
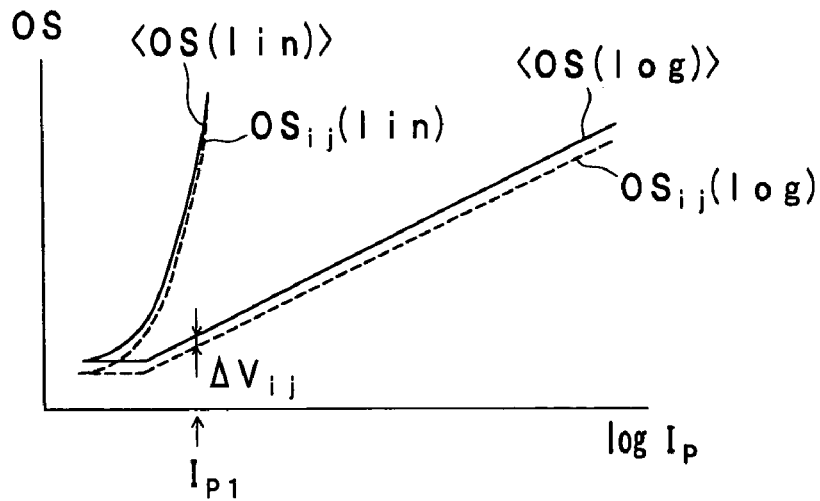

FIG. 7C is a graph showing the output signal of the image sensor of the present invention with the logarithm log(Ip) of the intensity of incident light represented by the horizontal axis. In this case, the solid line indicates a mean value <OS> of all the pixels, and the dashed line indicates a value OSij of a specified pixel (pixel having an address of i-th row and j-th column). In the case of the pixel shown in FIG. 1A, the response of each pixel accompanies a specific offset variation ΔVij due to the variations of the thresholds of the transistors 4 and 6, and the value of ΔVij varies every pixel. Therefore, when the response of each pixel is directly used as an image signal, the image quality is largely impaired by the harsh fixed pattern noises of ΔVij.

Figure 8A:
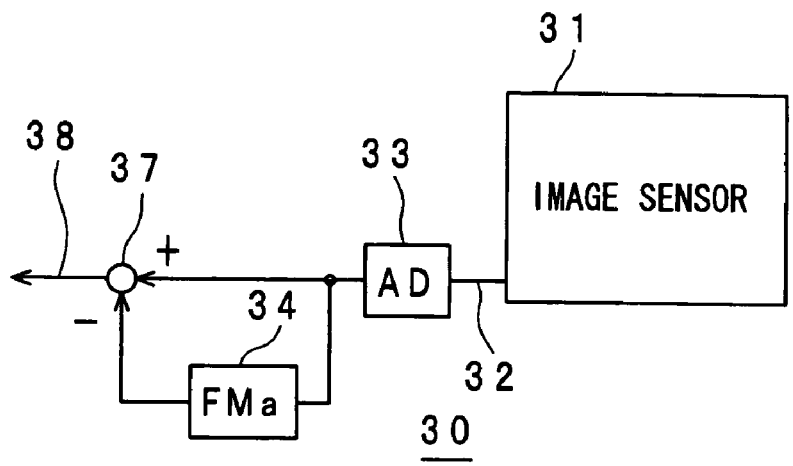
FIGS. 8A and 8B are diagrams showing systems for performing image signal processing with the two-dimensional image sensor of the present invention.

FIG. 8A illustrates a circuit construction 30 for solving the problems concerning the fixed pattern noises. In the circuit construction 30, an analog signal from the image sensor 31 (identical to the image sensor 10 shown in FIG. 5) of the present invention is converted into a digital signal by an AD converter 33. The signal from the AD converter 33 is diverged so that one branch is guided directly to a difference circuit 37 as one example of a subtraction part and the other branch is guided to the difference circuit 37 via a frame memory 34 served as a first frame memory. When a logarithmically converted photoelectric conversion signal is outputted from the image sensor 31 under the condition that light is irradiated to each pixel with a uniform intensity (denoted by Ip1 in FIG. 7C), the signal is recorded in the frame memory 34 every pixel. By this operation, the offset variation ΔVij of each pixel is recorded in the frame memory 34. Next, the difference circuit 37 subtracts the signal recorded in the frame memory 34 from the signal read in an arbitrary frame under the subject imaging condition in association with each pixel. By this operation, the offset variation ΔVij is canceled in all the frame signals, i.e., the logarithmically converted photoelectric conversion signal OS(log) and the linear type photoelectric conversion signal OS(lin), and an image signal free from the fixed harsh noises can be obtained.

The linear type photoelectric conversion signal OS(lin) in FIG. 8A has a characteristic that the logarithmic characteristic and the linear characteristic are added to each other although the offset variation ΔVij is canceled. For the above reasons, there is no problem because of an almost linear characteristic when the linear characteristic value is sufficiently greater than the logarithmic characteristic value as in FIG. 7A, a problem occurs due to a nonlinear characteristic when the linear characteristic value becomes lower than the logarithmic characteristic value as in FIG. 7B.

Figure 8B:
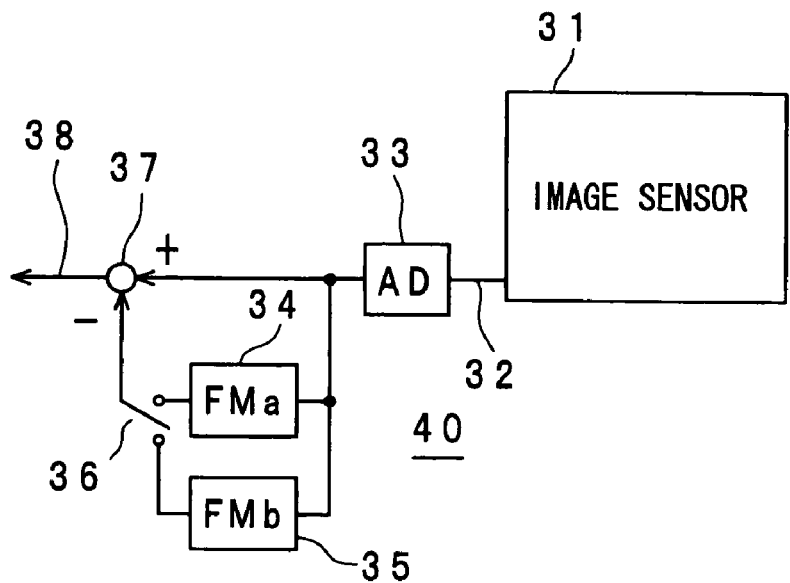

FIG. 8B illustrates another circuit construction 40 for solving the problem concerning the linear characteristic. In the present circuit construction 40, an analog signal from the image sensor 31 of the present invention is converted into a digital signal by the AD converter 33. The signal from the AD converter 33 is diverged into three branches, and the first branch is directly guided to the difference circuit 37 as one example of the subtraction part. The second branch is guided to the difference circuit 37 via a frame memory 34 as a first frame memory and a changeover switch 36. Moreover, the third branch is guided to the difference circuit 37 via a frame memory 35 as a second frame memory and the changeover switch 36. A logarithmically converted photoelectric conversion signal from the image sensor 31 is recorded every pixel in the frame memory 34 under the condition that light is applied with a certain uniform intensity to each pixel as in the case of FIG. 8A. As a result, the offset variation ΔVij of each pixel is recorded in the frame memory 34. A logarithmic signal read immediately before the reset gate voltage changes from High level to Low level under the subject imaging condition is recorded in a rewrite manner in the frame memory 35. Since the changeover switch 36 is connected to the frame memory 35 side during linear signal read, the signal recorded in the frame memory 35 is subtracted from the linear signal read immediately before the reset gate voltage changes next from Low level to High level in correspondence with each pixel. As a result, only the net linear signal corresponding to the signal charge stored during the optical integration period is read. Furthermore, random noises accompanying the reset operation are also canceled through the subtraction process as a merit of the present technique, and therefore, not only the fixed noises but also the random noises can largely be reduced. On the other hand, the changeover switch 36 is connected to the frame memory 34 side during the logarithmic signal read, and therefore, the difference circuit 37 subtracts the signal recorded in the frame memory 34 from the logarithmic signal in correspondence with each pixel. As a result, the offset variation $\Delta Vij$ is canceled in the logarithmically converted photoelectric conversion signal OS(log), and an image signal free from fixed harsh noises can be obtained.

Figure 9A:
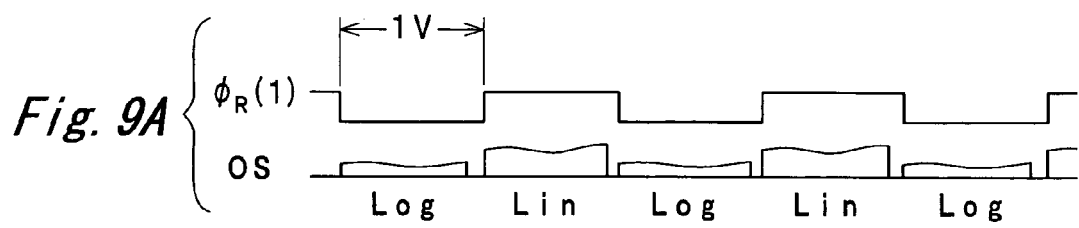
FIGS. 9A, 9B and 9C are charts showing other examples of the operation timing in the two-dimensional image sensor of the present invention.
Figure 9B:
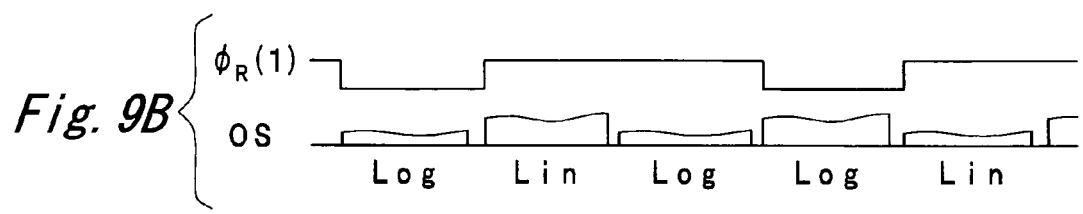
Figure 9C:
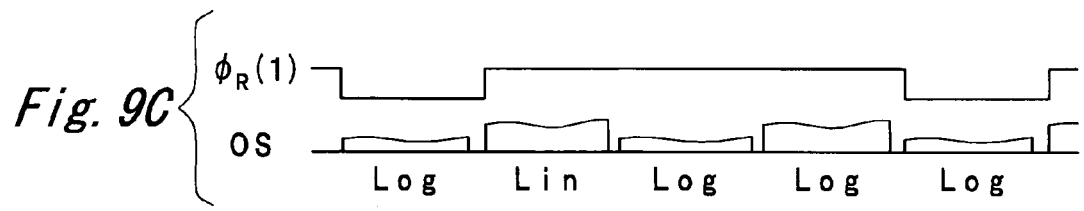
Figure 10A:
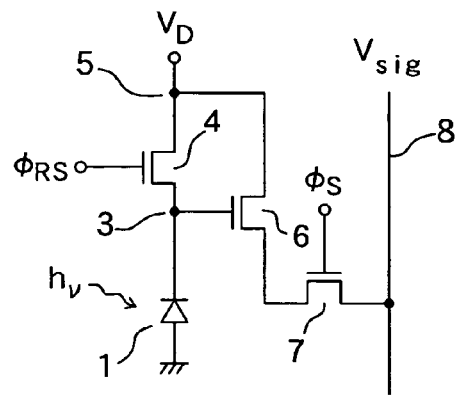
FIGS. 10A and 10B are diagrams for explaining the operation of the pixel of a conventional linear conversion type solid-state imaging device.
Figure 10B:
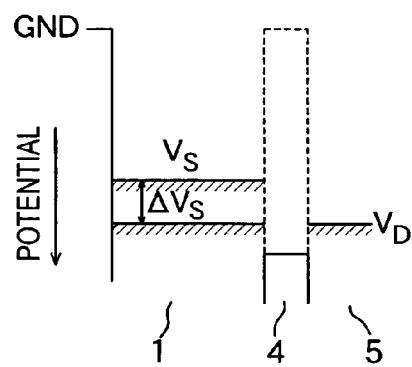
Figure 11A:
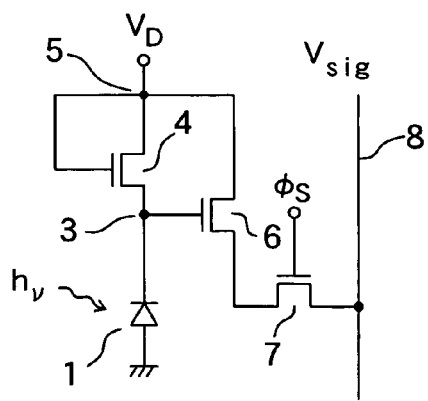
FIGS. 11A and 11B are diagrams for explaining the operation of the pixel of a conventional logarithmic conversion type solid-state imaging device.
Figure 11B:
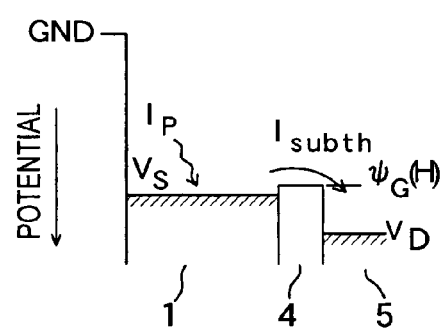
Figure 12A:
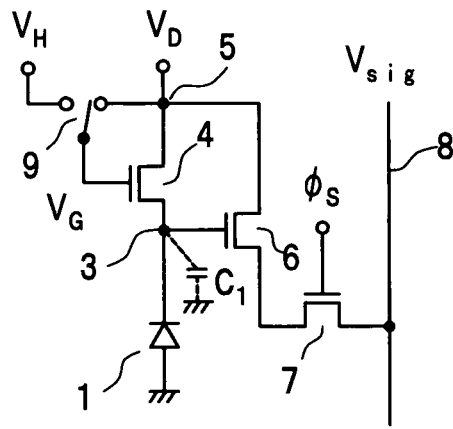
FIGS. 12A, 12B, 12C and 12D are diagrams for explaining the operation of the pixel of a conventional solid-state imaging device in which the linear conversion characteristic and the logarithmic conversion characteristic are added to each other.
Figure 12B:
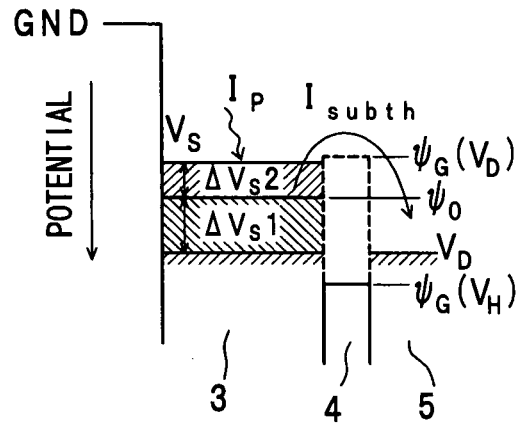
Figure 12C:
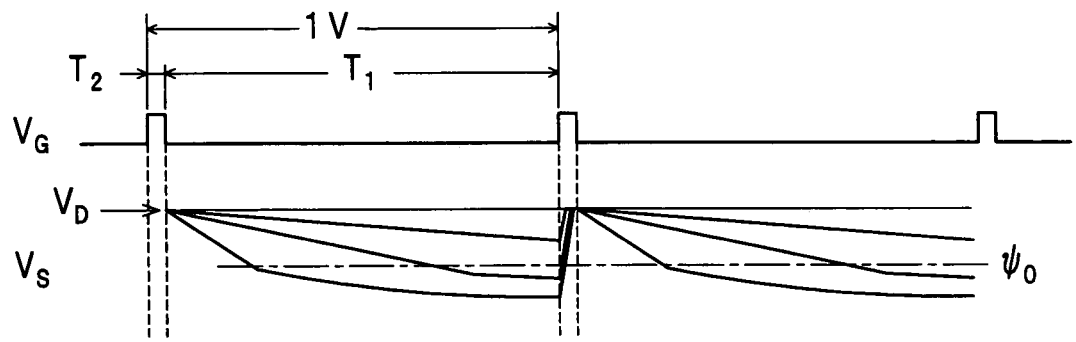
Figure 12D:
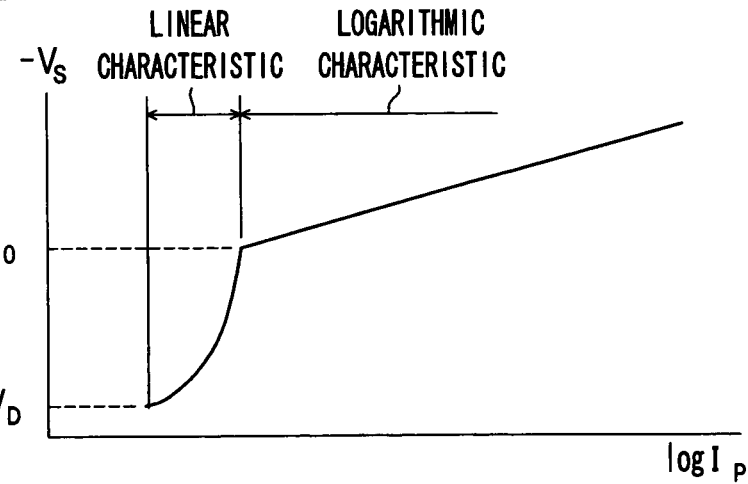

Although the case where the logarithmic operation period and the linear operation period are alternately repeated every one-frame period has been described in the example (FIG. 6), the present invention is not limited to this. Various combinations as shown in FIGS. 9A, 9B and 9C are possible. FIG. 9A is the same as the case of FIG. 6, and FIG. 9B shows a case where the linear operation period of one frame and the logarithmic operation period of two frames are alternately repeated. FIG. 9C shows a case where the linear operation period of one frame and the logarithmic operation period of three frames are alternately repeated. Likewise, other combinations are, of course, possible.

What is claimed is:

1. A solid-state imaging device in which a photodiode and a first transistor are provided in series between a ground and a drain in each pixel, and a signal corresponding to a current or an electric charge generated in the photodiode according to an optical input is outputted from a detection node located between the photodiode and the first transistor, comprising:
   a control part that executes control to provide a logarithmic operation first period during which a photoelectric conversion signal logarithmically converted by setting a gate voltage of the first transistor to a first level is obtained followed by a linear operation second period during which a linear photoelectric conversion signal is obtained by setting the gate voltage of the first transistor to a second level, and to repeatedly alternate a logarithmic operation period and a linear operation period.

2. The solid-state imaging device as claimed in claim 1, wherein the photodiode and the detection node are connected to each other.

3. The solid-state imaging device as claimed in claim 1, wherein a second transistor is connected between the photodiode and the detection node.

4. The solid-state imaging device as claimed in claim 3, wherein the photodiode has a buried-channel structure.

5. A solid-state imaging device in which a photodiode and a first transistor are provided in series between a ground and a drain in each pixel, and a signal corresponding to a current or an electric charge generated in the photodiode according to an optical input is outputted from a detection node located between the photodiode and the first transistor, comprising:
   a control part that executes control to provide a logarithmic operation first period during which a photoelectric conversion signal logarithmically convened by setting a gate voltage of the first transistor to a first level is obtained and followed by a linear operation second period during which a linear photoelectric conversion signal is obtained by setting the gate voltage of the first transistor to a second level, and to repeatedly alternate a logarithmic operation period and a linear operation period,
   wherein the control part executes control so as to alternately repeat the logarithmic operation period and the linear operation period every frame, read a potential of the detection node as a linear type signal immediately before a transition from the linear operation period to the logarithmic operation period, and read the potential of the detection node as a logarithmic signal in the logarithmic operation period after a lapse of a certain period after the transition to the logarithmic operation period.

6. The solid-state imaging device as claimed in claim 5, comprising:
   a first frame memory which stores a signal read from the detection node of each pixel in the logarithmic operation period under a condition that light is irradiated to each pixel with a certain uniform intensity; and
   a subtraction part which subsequently forms an output by subtracting the signal recorded in the first frame memory from a signal read in an arbitrary frame in association with each pixel.

7. The solid-state imaging device as claimed in claim 6, wherein
   the subtraction part forms an output by subtracting the signal recorded in the first frame memory from a signal read in the logarithmic operation period in association with each pixel.

8. The solid-state imaging device as claimed in claim 5, comprising:
   a second frame memory which records the signal read from the detection node every time immediately before the transition from the logarithmic operation period to the linear operation period under a subject imaging condition; and
   a subtraction part which subtracts the signal recorded in the second frame memory from the signal read from the detection node immediately before the transition from the linear operation period to the logarithmic operation period in association with each pixel.

* * * * *